(12) United States Patent
Breton et al.

(10) Patent No.: US 8,934,593 B2
(45) Date of Patent: Jan. 13, 2015

(54) VERY HIGH PRECISION DEVICE FOR MEASURING THE TIME A SIGNAL IS INPUT

(75) Inventors: Dominique Breton, Gif sur Yvette (FR); Eric Delagnes, Chaville (FR); Jean-Francois Genat, Boulogne-Billancourt (FR)

(73) Assignees: Centre National de la Recherche Scientifique, Paris (FR); Commissariat a l'Energie Atomqiue et aux Energies Alternatives, Paris (FR); Universite Paris-SUD 11, Orsay Cedex (FR)

( * ) Notice: Subject to any disclaimer, the term of this patent is extended or adjusted under 35 U.S.C. 154(b) by 0 days.

(21) Appl. No.: 13/379,542

(22) PCT Filed: Jun. 21, 2010

(86) PCT No.: PCT/FR2010/051258
§ 371 (c)(1),
(2), (4) Date: Apr. 13, 2012

(87) PCT Pub. No.: WO2010/149920
PCT Pub. Date: Dec. 29, 2010

(65) Prior Publication Data
US 2012/0187996 A1      Jul. 26, 2012

(30) Foreign Application Priority Data
Jun. 22, 2009   (FR) ...................................... 09 54226

(51) Int. Cl.
*H04L 7/00*   (2006.01)
*H03H 11/26*   (2006.01)

(52) U.S. Cl.
CPC ..................................... *H03H 11/26* (2013.01)
USPC ........................................................ 375/355

(58) Field of Classification Search
USPC .................................................... 375/355, 340
See application file for complete search history.

(56) References Cited

U.S. PATENT DOCUMENTS

| 4,439,046 | A |   | 3/1984 | Hoppe |
| 5,619,445 | A |   | 4/1997 | Hyatt |
| 2004/0062325 | A1 | * | 4/2004 | England et al. ............... 375/340 |
| 2009/0219797 | A1 | * | 9/2009 | Tahara et al. .............. 369/47.35 |

OTHER PUBLICATIONS

Norhuzaimin J. et al. "The Design of High Speed UART", Applied Electromagnetics, 2005. APACE 2005. Asia-Pacific Conference on Johor, Malaysia Dec. 20-21, 2005, Piscataway, NJ, USA, IEEE LNKD—DOI:10.1109/APACE.2005.1607831, Dec. 20, 2005, pp. 306-310, XP010903062, ISBN: 978-0-7803-9431-5.

* cited by examiner

*Primary Examiner* — Tanmay Shah
(74) *Attorney, Agent, or Firm* — Davidson, Davidson & Kappel, LLC

(57) ABSTRACT

The invention provides a device including a binary pulse input signal converter, the output of which is connected to a counter and to a delay line that includes a plurality of delay elements. The counter and the delay line also receive a clock signal as an input. The delay line is combined with a sampler and analog memory that includes a plurality of storage cells that receive the input signal as input. Each element of the a delay line includes an output connected to a corresponding storage cell of the analog so as to sequentially control the sampling and storage of the input signal in the storage cells.

6 Claims, 2 Drawing Sheets

VERY HIGH PRECISION DEVICE FOR MEASURING THE TIME A SIGNAL IS INPUT

This invention relates to a device for measuring the time a signal is input.

BACKGROUND

In the remainder of this document, the term "signal" is used to denote an analog or digital signal, and a digital signal will be treated the same way as an analog signal.

More specifically, the invention relates to such a device for measuring time at very high precision, known in the state of the art, based on the use of a timed counter by a clock, and associated with a delay line with a plurality of basic delay elements, for example equal in length. For example, such a delay line may contain delay elements D for a period equal to td.

The sum of the elementary delays D×td can be controlled by the clock period. In another case, it must be regularly calibrated.

Additional elementary delays are sometimes used, most often to compensate for side effects.

Thus, and in such a device, the input signal is firstly converted into a binary pulse by converter means, for example based on the use of a discriminator.

In its simplest embodiment, this discriminator can for example be a simple comparator, comparing the input signal to a set threshold value. However, to obtain correct dating, this discriminator is often a more complex device, the propagation time of which must be thoroughly controlled.

The measurement of time is then performed on the binary signal issued by the discriminator by the assembly including the counter and the delay line.

When the pulse reaches the discriminator output, or upon a subsequent clock edge, the counter and the delay line are either stopped or recopied into another record or storage element.

The delay line then gives the thin part of the measurement time within the clock period in addition to the counter.

However, this device has two major drawbacks, namely:

the discriminator has a reaction time depending on the shape and amplitude of the input signal and the discrimination threshold, and the time measurement pitch is that of the delay line, limited to the first order by the microelectronic technology chosen for the corresponding circuit.

Several improvements to this type of device have already been proposed in the state of the art.

Thus, for example and with regard to the discriminator, the use of a constant fraction discriminator makes it possible to make the first order the propagation time independent from the signal amplitude. Nevertheless, this only works on amplitude-homothetic signals. In addition, the integration of such a discriminator in a circuit of the ASIC type has great difficulties.

The improvements related to the delay lines call mostly for an interpolation among several of the latter. Although these solutions provide a significant gain in precision, they also have a number of drawbacks, including:

a complexity of their operating principle and practical execution, an increase in the surface area required for the physical implementation and consumption related to the additional delay lines, and the general need for heavy and frequent calibration.

It will be noted that it is possible to minimize downtime associated with the acquisition of such a device for example by replacing the records in which the states of the counter and the delay line are copied with double port storage of the FIFO type, for example. The integration of multi-path microelectronics of this type of devices is carried out conventionally.

In practice, the resolution of this type of devices is limited to a few tens of picoseconds rms.

Alternatively, the thin timing part of the measurement device can be replaced with a time amplitude converter made by a voltage ramp generator started by the output of the discriminator and stopped by the clock. This voltage digitized by an analog-digital converter (ADC) is an image of the thin time. The thin dating pitch of the device here only depends on the slope of the ramp and the ADC pitch. The speed of the microelectronic technology used does not appear here to be a limitation to the resolution.

On the contrary, the resolution of this type of device is limited by the noise on the ramp, its linearity, and the precision (and artefacts) of starting and stopping of the ramp generator. Therefore, in its integrated version, the temporal resolution (of the measuring device only) is at best in the vicinity of 10 ps rms. This implementation is on the contrary adverse in terms of downtime and even requires a calibration that could be complex.

SUMMARY OF THE INVENTION

An object of the invention is therefore to solve the problems associated with the pre-existing devices.

To this end, the present invention provides a device for measuring the time a signal is input, of the type comprising means for converting the input signal into binary pulses, the output of which is connected to counter means and delay line means with multiple delay elements, the counter means and the delay line means also receiving an input clock signal, characterized in that the delay line means are combined with means forming a sampler and analog memory comprising multiple storage cells, receiving the input signal as input, and in that each element of the delay line means has an output connected to a corresponding storage cell of the means forming analogue memory for sequentially controlling the sampling and the storage of the input signal in the latter.

According to other aspects of the invention, the time measuring device may comprise one or more of the following features:

the delay line means are controlled in duration and phase by the clock period or one of its multiples.

the analog memory means are associated in output to at least one analog-digital converter, the delay means are interposed between the conversion means on the one hand and the counter means and delay line means on the other hand, the conversion means comprise a discriminator comprising a comparator for comparing the input signal to a set threshold value, and the conversion means comprise a controlled propagation time discriminator.

BRIEF DESCRIPTION OF THE DRAWINGS

The invention will be better understood through the following description, given solely as an example and in reference to the appended drawings, wherein.

DETAILED DESCRIPTION

Figure 1:
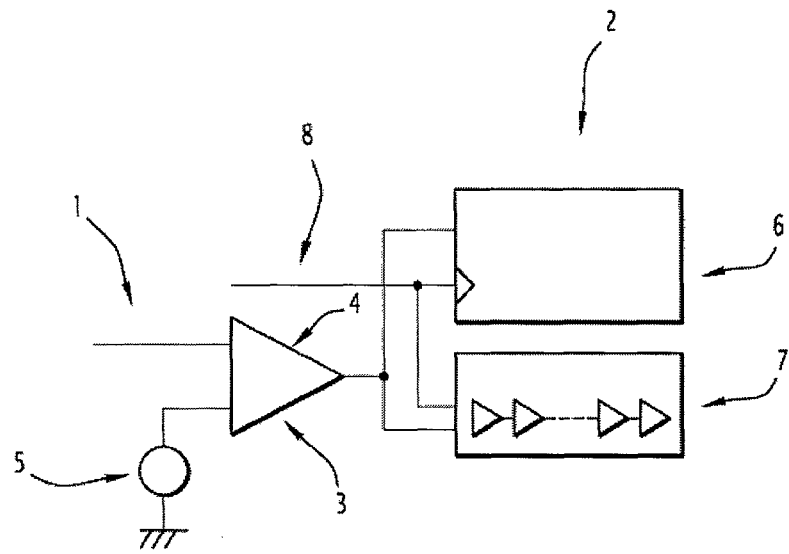
FIG. 1 shows a block diagram illustrating the structure and operation of a measuring device of the state of the art.

FIG. 1 illustrates a device for measuring the arrival time of an input signal, the input signal being designated by general reference 1 in this figure, and the measuring device being designated by general reference 2.

As noted earlier, such a device comprises a binary pulse input signal converting means, for example, a converter, these means being designated by general reference 3 and comprising for example a discriminator as a comparator in the simplest embodiment, designated by general reference 4, adapted for comparing the input signal 1 to a threshold value, for example a set threshold value, as issued by corresponding threshold value source designated by general reference 5.

The output of the discriminator 4 is then a stop or copy binary pulse, which is then delivered in output from the comparator to counter means, for example, a counter designated by general reference 6 and delay line means comprising a plurality of delay elements and designated by general reference 7.

These counter means and delay line means also receive a clock signal in input, designated in this figure by general reference 8.

The operating principle of this device has been described in the preamble to the description.

Figure 2:
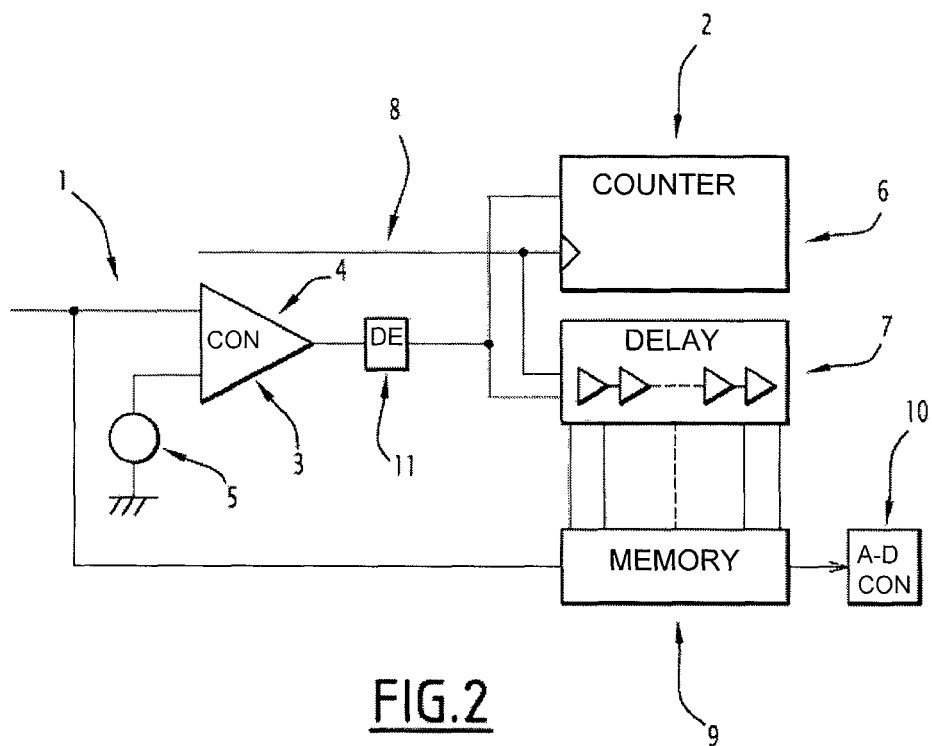
FIG. 2 shows a block diagram illustrating the structure and operation of a measuring device according to the invention.

FIG. 2 shows a block diagram of an embodiment of a measuring device according to the invention making it possible to resolve the above mentioned problems.

In this FIG. 2, elements identical or similar to those already described with reference to FIG. 1 are designated by the same references.

Thus, in this FIG. 2, also uses the input signal 1, measuring device 2, conversion means, converter 3, and comparator 4, and the threshold value source 5 for setting the threshold value, the counter means, counter 6, delay line means, delay line 7 and the clock signal 8.

The delay line means 7 are controlled in duration and phase by the clock period or one of its multiples.

To solve the problems described above, in the measuring device according to the invention, the delay line means 7 are combined with sampler and analog memory means with multiple storage cells, and designated by general reference 9 in this FIG. 2.

These sampler and analog memory means 9 receive the input signal 1 in input and have any suitable conventional structure.

In addition, each element of the delay line means has an output connected to a storage cell corresponding to the sampler and analog memory means to drive the sampling and storage of the input signal therein sequentially.

At least one analog-digital converter designated by general reference 10 can be associated with the output of the sampler and the analogue memory means 9.

In addition, delay means, a delay element, designated by general reference 11 can be interposed between the conversion means 3 on the one hand and the counter means 6 and the delay line means 7 on the other hand.

Such a structure makes it possible to resolve the various problems mentioned above very simply.

In fact, in this structure, every pitch of the delay line is associated with a storage cell, which samples at a frequency equal to the inverse of the pitch of said delay line and records the raw input signal (not discriminated) in an analog manner.

During the acquisition phase, the pitch outputs of the delay line then sequentially control the sampling and the input signal storage in an analog manner in associated storage cells.

Figure 3:
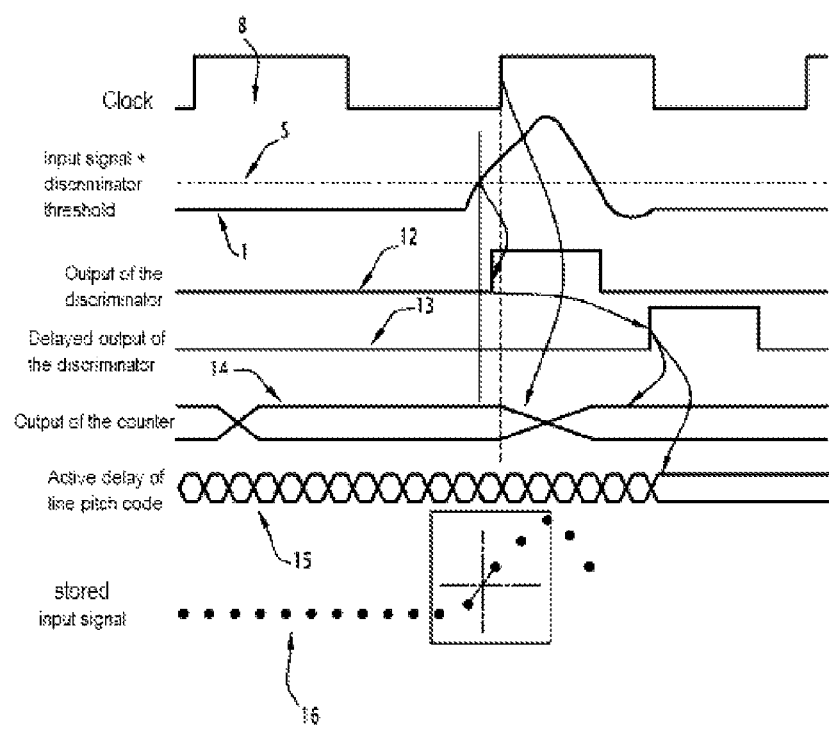
FIG. 3 shows various signals illustrating the operation of a measuring device according to the invention.

The output pulse of the discriminator 4, due to its finished reaction time, shows a delay on the input line, as illustrated in FIG. 3. This pulse then stops the sampling in the analog memory and simultaneously initiates taking the digital time (stop or copy of the counter and delay line assembly). If necessary, this delay can be voluntarily extended to ensure complete capture of the signal. In this case, the counter and the delay line are copied or stopped on the basis of the delayed pulse. The delay line can even be voluntarily extended for this purpose.

It should be noted that in this structure, the reproducibility and precision of these delays are not involved in the precision of the measurement, which is related to the sampling in the analogue memory.

The storage cells then contain the waveform of the input signal sampled analogically on a contemporary time interval to the rise of the discriminator output binary pulse.

This waveform makes it possible, owing to a digital processing of recorded analog data, to refine the time measurement, done roughly by the counter.

For this reason, this waveform is firstly digitized by an analog-digital converter such as converter 10, before applying adapted digital analysis techniques conventionally.

This method makes it possible to provide precision far beyond that of the sampling pitch of the delay line, typically in the vicinity of 1 to 2 orders of magnitude.

The lack of shaping of the sampled signal makes it possible to avoid any jitter associated with it or the analog discrimination operation.

Nevertheless, the discriminator remains necessary to stop recording the signal, but the time precision required of the latter is relaxed because it is no longer taken into consideration in the final precision of the measurement. In this solution, the number of critical elements of the chain is therefore drastically reduced. The only remaining critical parameters are the bandwidth and the signal-to-noise ratio of the analog part of the system. However, and this is only in order to limit the required recording depth, a controlled propagation time discriminator, such as a constant fraction discriminator, can also be used, but with the integration problems mentioned above.

In the device according to the invention, as in the devices of the prior art, the synchronization and management problem of potential metastability between the counter and the delay line still arises and can be solved in the conventional way because it is only related to the stop or copy of the delay line and counter.

This is illustrated in FIG. 3, which again shows the clock signal 8, input signal 1, preset threshold value delivered by the means 5, and the output of the discriminator 4 designated by general reference 12 in this figure, before passing through the delay element 11. The output of these delay means is then designated by general reference 13, if used. In 14, the output of the counter 6 is shown, and in 15, the active delay line pitch code 7. Finally, in 16 the input signal stored in the analog memory means 9, and specifically in the various cells thereof, is shown. This signal is then in the form of analog samples. These samples may be used to extract a thin time by interpolation, as illustrated, the precision obtained being related to the signal to noise ratio of the analog samples, in the number thereof used for the calculation and the power of the interpolation algorithm.

It will be noted that a simple linear interpolation already yields excellent results, especially if the sampling frequency is much higher than the bandwidth. A calculation algorithm reproducing a constant fraction discriminator can further improve the measurement precision. Calculations based on cross-correlation with a reference signal can still make it possible to refine the results because they make it possible to abstract part of the noise on the signal. This type of digital processing of the signal is well known to those of ordinary skill in the art, and will not be described in more detail below.

It goes without saying, of course, that other embodiments may also be considered.

As part of this invention, as in conventional solutions, it is possible to work without downtime by using a bank comprising a plurality of delay line sets and the counter used alternately.

The invention claimed is:

1. A device for measuring the time a signal is input, of the type comprising:
   a converter for converting an unconverted raw input signal into binary pulses;
   a counter and a delay line connected to an output of the converter, the delay line including a plurality of delay elements;
   a clock signal, the counter and the delay line receiving the clock signal as an input;
   a sampler and analog memory including multiple storage cells, the sampler and analog memory having an input for receiving the unconverted raw input signal, each delay element of the delay line having an output connected to a corresponding storage cell of the sampler and analog memory to sequentially drive the sampling and storage of the unconverted raw input signal in the storage cells.

2. The device for measuring the time a signal is input according to claim 1, wherein the delay line is controlled in duration and phase by a clock period or one of a multiple thereof.

3. The device for measuring the time a signal is input according to claim 1, wherein the sampler and analog memory has an output connected with at least one analog-digital converter.

4. The device for measuring the time a signal is input according to claim 1, wherein the converter includes a discriminator having a comparator of the unconverted raw input signal at a set threshold value.

5. A device for measuring the time a signal is input according to claim 1, wherein the converter includes a controlled propagation time discriminator.

6. A device for measuring the time a signal is input comprising:
   a converter for converting an input signal into binary pulses;
   a counter and a delay line connected to an output of the converter, the delay line including a plurality of delay elements;
   a clock signal, the counter and the delay line receiving the clock signal as an input;
   a sampler and analog memory including multiple storage cells, the sampler and analog memory having an input for receiving the input signal, each delay element of the delay line having an output connected to a corresponding storage cell of the sampler and analog memory to sequentially drive the sampling and storage of the input signal in the storage cells; and
   a further delay element interposed among the converter on one side and the counter and the delay line on another side.

* * * * *